United States Patent
Michiyoshi

(10) Patent No.: US 8,242,848 B2
(45) Date of Patent: Aug. 14, 2012

(54) OSCILLATION FREQUENCY CONTROL CIRCUIT, AND DC-DC CONVERTER AND SEMICONDUCTOR DEVICE HAVING THE SAME

(75) Inventor: Takashi Michiyoshi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 119 days.

(21) Appl. No.: 12/864,465

(22) PCT Filed: Jan. 16, 2009

(86) PCT No.: PCT/JP2009/051013
§ 371 (c)(1),
(2), (4) Date: Jul. 23, 2010

(87) PCT Pub. No.: WO2009/098950
PCT Pub. Date: Aug. 13, 2009

(65) Prior Publication Data
US 2011/0130103 A1    Jun. 2, 2011

(30) Foreign Application Priority Data
Feb. 6, 2008 (JP) .................. 2008-026454

(51) Int. Cl.
*H03J 7/04* (2006.01)
*H03L 7/02* (2006.01)

(52) U.S. Cl. ........... 331/1 R; 331/7; 331/10; 331/11; 331/18; 331/25; 331/40; 323/282; 327/114; 455/127.1

(58) Field of Classification Search ........ 455/127.1; 327/114; 323/282; 331/1 R, 7, 10, 11, 18, 331/25, 40
See application file for complete search history.

(56) References Cited

U.S. PATENT DOCUMENTS

| | | | | |
|---|---|---|---|---|
| 5,739,709 A | * | 4/1998 | Banno | 327/156 |
| 6,392,494 B2 | * | 5/2002 | Takeyabu et al. | 331/11 |
| 6,525,578 B2 | * | 2/2003 | Ooishi | 327/156 |

FOREIGN PATENT DOCUMENTS

| | | |
|---|---|---|
| JP | 8-44465 | 2/1996 |
| JP | 9-266425 | 10/1997 |
| JP | 9-266426 | 10/1997 |
| JP | 11-341793 | 12/1999 |
| JP | 2001-45084 | 2/2001 |
| JP | 2005-210270 | 8/2005 |
| JP | 2006-262121 | 9/2006 |
| JP | 2007-164952 | 6/2007 |
| JP | 2007-208881 | 8/2007 |

OTHER PUBLICATIONS

International Search Report in PCT/JP2009/051013.

* cited by examiner

*Primary Examiner* — Arnold Kinkead
*Assistant Examiner* — Richard Tan
(74) *Attorney, Agent, or Firm* — Cooper & Dunham LLP

(57) ABSTRACT

An oscillation frequency control circuit configured to control a frequency of a second clock signal of an oscillation circuit generating and outputting the second clock signal having a frequency in response to an input control signal is disclosed. The oscillation frequency control circuit includes a frequency difference detection circuit unit configured to detect a difference between a frequency of a predetermined first clock signal input externally and the frequency of the second clock signal, and generate and output a signal indicating a result of the detection; and a frequency control circuit unit configured to control the frequency of the second clock signal so that the frequency of the second clock signal continually changes back and forth between a predetermined lower limit value and a predetermined upper limit value in response to the output signal from the frequency difference detection circuit.

15 Claims, 8 Drawing Sheets

OSCILLATION FREQUENCY CONTROL CIRCUIT, AND DC-DC CONVERTER AND SEMICONDUCTOR DEVICE HAVING THE SAME

TECHNICAL FIELD

The present invention relates to an oscillation frequency control circuit, and more particularly to an oscillation frequency control circuit for controlling an oscillation circuit used in a DC-DC converter integrated in a semiconductor device in which a radio transmitting and receiving circuit is also integrated.

BACKGROUND ART

Recently, to promote energy saving in electronic devices, switching regulators with improved efficiency have been used. However, switching regulators produce switching noise when the switching device in the switching regulator is turned ON and OFF, and the switching noise is produced not only at the switching frequency but also at the harmonic frequencies which are integral multiples of the switching frequency. Because of this feature, when a switching regulator and a radio transmitting and receiving circuit are integrated into the same semiconductor device, there may arise a problem that the switching noise from the switching regulator exerts harmful effect on the frequencies used in the radio transmitting and receiving circuit.

FIGS. 6 through 8 show exemplary configurations of a clock signal generation circuit configured to drive a switching transistor in conventional DC-DC converters (see, for example, Patent Documents 1 and 2)

First, the operation of the configuration shown in FIG. 6 is described.

As shown in FIG. 6, a resonator 156 is connected to a reference oscillation circuit 155. The reference oscillation circuit 155 generates an oscillation signal FT having a constant frequency based on the resonator 156. A divider 157 divides the oscillation signal FT to generate a signal CC and outputs the signal CC to a phase comparator 158. The phase comparator 158 compares the phase of the signal CC with the phase of a division signal CD output from a dividing section 164 and generates a frequency error signal EFC. The frequency error signal EFC is supplied to the base of an NPN transistor 160 through a low pass filter 159.

An oscillation section 161 includes a CR oscillation circuit and outputs an oscillation signal Fs. The frequency of the oscillation signal Fs is determined by a resistor 162 and a capacitor 163. The NPN transistor 160 is connected in parallel to the resistor 162. Therefore, the resistance value of the resistor 162 changes in accordance with the operation of the NPN transistor 160, thereby enabling changing the frequency of the oscillation signal Fs. The oscillation signal Fs is supplied to the dividing section 164 and a DC-DC control circuit (not shown) configured to control the operation of the switching transistor of the DC-DC converter. The dividing section 164 divides the oscillation signal Fs by a predetermined division ratio which is set by a division control signal BC output from a micro-computer (not shown) for selecting a station, the micro-computer being included in a tuner section (not shown) used for receiving radio broadcast signals.

For example, the divider 157 divides the oscillation signal FT and generates a signal having a frequency of 5 kHz. Further, the dividing section 164 divides the oscillation signal Fs to generate and output the division signal CD having a frequency one-twentieth (1/20) of that of the oscillation signal Fs. The phase comparator 158 compares the phase of the signal CC with the phase of a division signal CD, and generates the frequency error signal EFC so that the frequency of the signal CC becomes equal to the frequency of the division signal CD. The phase comparator 158 supplies the generated frequency error signal EFC to the NPN transistor 160. As a result, the frequency of the oscillation signal Fs generated by the oscillation section 161 becomes 100 kHz. In the DC-DC control circuit (not shown), the switching transistor switches based on the oscillation signal Fs. Therefore, noise having a fundamental frequency of 100 kHz and its harmonic frequencies which are the integral multiples of 100 kHz is generated.

Next, when a broadcast wave having a frequency of, for example, 999 kHz is received by operating a tuner section, the division ratio of the dividing section 164 is set to 21 by the division control signal BC. By setting this way, the frequency of the oscillation signal Fs is divided by 21 to generate the division signal CD having a frequency of about 4.76 kHz. As described, the phase comparator 158 generates and outputs the frequency error signal EFC to increase the frequency of the oscillation signal Fs so that the frequency of the division signal CD becomes 5 kHz. Namely, the frequency of the oscillation signal Fs increases up to 105 kHz so that the division signal CD having a frequency of 5 kHz is obtained under the condition of the division ratio of 21 (divided by 21). As a result, the switching transistor (not shown) is driven based on the oscillation signal Fs having a frequency of 105 kHz, and the frequency of the switching noise becomes different from the frequencies of the receiving range of the broadcast wave and the intermediate frequency signal, thereby enabling avoiding poor reception status.

Next, the operation of the configuration shown in FIG. 7 is described.

As shown in FIG. 7, a reference signal CB having a predetermined frequency generated by a tuner section (not shown) and a division signal CD output from the dividing section 164 are input to a phase comparator 165. The phase comparator 165 compares the phase of the reference signal CB with the phase of a division signal CD, and generates and supplies the frequency error signal EFE to the base of the NPN transistor 160 through the low pass filter 159. When the division ratio of the dividing section 164 is set to 12 and the frequency between broadcast stations is 9 kHz, this 9 kHz is set as the frequency of the reference signal CB and the reference signal CB having a frequency of 9 kHz is input to the phase comparator 165.

The phase comparator 165 generates a frequency error signal (EFE) so that the frequency of the reference signal CB is equal to that of the division signal CD. As a result, the frequency of the oscillation signal Fs generated by the oscillation section 161 becomes 108 kHz. Under this condition, if a broadcast wave having a frequency of 1080 kHz is to be received, since this frequency (1080 kHz) is equal to the frequency of one of the harmonic components of the switching noise of the oscillation signal Fs, namely ten times the frequency (108 kHz) of the oscillation signal Fs, the reception status is affected by the switching noise. To avoid the problem, the division ratio of the dividing section 164 is changed to 13 using the division control signal BC. By setting this way, the frequency of the oscillation signal Fs is changed to 117 kHz and therefore, the frequencies of the harmonic components of the switching noise are out of the reception range of the broadcast wave, thereby avoiding the occurrence of poor reception.

Next, the operation of the configuration shown in FIG. 8 is described.

As shown in FIG. 8, a resonator 167 is connected to a oscillation circuit 166. The oscillation circuit 166 generates an oscillation signal Fu having a constant frequency based on the resonator 167 and outputs the generated oscillation signal Fu to a dividing section 168. The dividing section 168 divides the oscillation signal Fu and generates and outputs an oscillation signal Fs. The oscillation signal Fs is supplied to the DC-DC control circuit (not shown) and used to drive the switching transistor.

Further, a division control section 169 is connected to the dividing section 168, and generates a division control signal BD to continually or intermittently switch the division ratio of the dividing section 168 at a predetermined time period.

Therefore, the division ratio of the dividing section 168 is continually or intermittently switched by the division control signal BD at the predetermined time period. As a result, the frequency of the oscillation signal Fs is accordingly switched at the predetermined time period.

As described above, the frequency of the oscillation signal Fs serving as a the switching signal is continually or intermittently changed. As a result, the fundamental frequency component and the harmonic frequency components of the generated noise are dispersed. Therefore, noise amount at a predetermined frequency per unit time can be reduced, thereby reducing the level of the generated noise to an acceptable level in practical use.

Patent Document 1: Japanese Patent Application Publication No.: H9-266425
Patent Document 2: Japanese Patent Application Publication No.: H9-266426

DISCLOSURE OF THE INVENTION

Problems to be Solved by the Invention

However, in configurations shown in FIGS. 6 and 7, a special control circuit such as a micro-computer is required to set the division ratio of the dividing section 164. Therefore, a system without such a control circuit cannot employ the above described methods.

Further, in the configuration as shown in FIG. 8, the oscillation signal Fs generated by dividing the oscillation signal Fu by the division ratio that is changed at the predetermined time period by the dividing section 168 is used as the switching signal. Because of this feature, the frequencies of the oscillation signal Fs are discrete frequencies. Further, the frequencies of the oscillation signal Fs are maintained as the same frequencies during the predetermined time period. Because of this feature, if the frequency of the tuner section corresponds to the fundamental frequency or any of the harmonic frequencies of the oscillation signal Fs, there arises a problem that the influence of the noise remains during the predetermined time period.

The present invention is made to solve at least one of the problems described above and may provide an oscillation frequency control circuit capable of reducing a switching noise level to a level at which the influence of the noise may be negligible without using a special control circuit such as a micro-computer and regardless of the frequency used in the radio transmitting and receiving circuit, and DC-DC converter and a semiconductor device using the oscillation frequency control circuit.

Means for Solving the Problems

According to an aspect of the present invention, an oscillation frequency control circuit is configured to control an oscillation circuit generating and outputting a second clock signal having a frequency in response to an input control signal so that the oscillation frequency control circuit controls the frequency of the second clock signal. The oscillation frequency control circuit includes a frequency difference detection circuit unit configured to detect a difference between a frequency of a predetermined first clock signal input externally and the frequency of the second clock signal, and generate and output a signal indicating a result of the detection; and a frequency control circuit unit configured to control the frequency of the second clock signal so that the frequency of the second clock signal continually changes back and forth between a predetermined lower limit value and a predetermined upper limit value in response to the output signal from the frequency difference detection circuit.

More specifically, the frequency difference detection circuit unit may include a first division circuit configured to divide the second clock signal by a preset first division ratio, and generate and output a first division clock signal;

a second division circuit configured to divide the second clock signal by a preset second division ratio, and generate and output a second division clock signal;

a first frequency comparison circuit configured to compare the frequency of the first clock signal with the frequency of the first division clock signal, and generate and output a signal indicating a result of the comparison; and a second frequency comparison circuit configured to compare the frequency of the first clock signal with the frequency of the second division clock signal, and generate and output a signal indicating a result of the comparison, wherein the frequency control circuit unit controls the oscillation circuit so that the frequency of the second clock signal continually changes back and forth between a predetermined lower limit value and a predetermined upper limit value in response to output signals from the first frequency comparison circuit and the second frequency comparison circuit.

In this case, the frequency control circuit unit may control the oscillation circuit so that when the output signal of the first frequency comparison circuit indicates that the frequency of the first division clock signal is lower than the frequency of the first clock signal, the frequency of the second clock signal is increased until the output signal of the second frequency comparison circuit indicates that the frequency of the second division clock signal is higher than the frequency of the first clock signal, and when the output signal of the second frequency comparison circuit indicates that the frequency of the second division clock signal is higher than the frequency of the first clock signal, the frequency of the second clock signal is reduced until the output signal of the first frequency comparison circuit indicates that the frequency of the first division clock signal is lower than the frequency of the first clock signal.

Further, the frequency control circuit unit may include
a first latch circuit having a set input terminal and a reset input terminal, the output signal of the first frequency comparison circuit being input to the set input terminal, and the output signal of the second frequency comparison circuit being input to the reset input terminal; and a second latch circuit having a set input terminal and a reset input terminal, the output signal of the second frequency comparison circuit being input to the set input terminal, and the output signal of the first frequency comparison circuit being input to the reset input terminal, wherein each of the first latch circuit and the second latch circuit is configured to output an output signal to the oscillation circuit to control the frequency of the second clock signal of the oscillation circuit.

Further, the frequency of the first division clock signal indicates a lower limit frequency of the second clock signal, and the frequency of the second division clock signal indicates an upper limit frequency of the second clock signal.

Further, each of the first division circuit and the second division circuit performs a division process by a division ratio indicated by a corresponding input signal.

Further, the frequency difference detection circuit unit may further include a random number generation circuit configured to randomly select and output one numeric value from among numeric values within a predetermined range in accordance with the output signal of the second frequency comparison circuit;

a first addition circuit configured to add a value output from the random number generation circuit to a predetermined first value and output a result of the addition to the first division circuit; and a second addition circuit configured to add a value output from the random number generation circuit to a predetermined second value and output a result of the addition to the second division circuit, wherein the first division circuit performs the division process by the division ratio in accordance with a numeric value input from the first addition circuit, and the second division circuit performs the division process by the division ratio in accordance with a numeric value input from the second addition circuit.

In this case, the random number generation circuit may randomly select and output one numeric value from among numeric values within the predetermined range when the output signal of the second frequency comparison circuit indicates that the frequency of the second division clock signal is higher than the frequency of the first clock signal.

Further, the frequency difference detection circuit unit may further include a random number generation circuit configured to randomly select and output one numeric value from among numeric values within a predetermined range in accordance with the output signal of the first frequency comparison circuit;

a first addition circuit configured to add a value output from the random number generation circuit to a predetermined first value and output a result of the addition to the first division circuit; and a second addition circuit configured to add a value output from the random number generation circuit to a predetermined second value and output a result of the addition to the second division circuit, wherein the first division circuit performs the division process by the division ratio in accordance with a numeric value input from the first addition circuit, and the second division circuit performs the division process by the division ratio in accordance with a numeric value input from the second addition circuit.

In this case, the random number generation circuit may randomly select and output one numeric value from among numeric values within the predetermined range when the output signal of the first frequency comparison circuit indicates that the frequency of the first division clock signal is lower than the frequency of the first clock signal.

Further, the predetermined first value and the predetermined second value may be determined so that a difference between the frequency of the first division clock signal and the frequency of the second division clock signal is kept substantially constant.

Further, the first clock signal is always being input to the frequency difference detection circuit unit at least when power is being supplied.

According to another aspect of the present invention, a DC-DC converter having a switching power supply circuit is provided. The DC-DC converter includes an oscillation circuit configured to generate and output a second clock signal having a frequency in response to an input control signal;

a control circuit configured to convert an input voltage to a predetermined constant voltage by performing switching control with respect to a switching device in the switching power supply circuit based on the second clock signal of the oscillation circuit; and an oscillation frequency control circuit described above, the oscillation frequency control circuit being configured to control the frequency of the second clock signal of the oscillation circuit.

More specifically, the switching power supply circuit may be configured to supply power to at least one of a radio transmitting circuit, a radio receiving circuit, and a radio transmitting and receiving circuit.

According to still another aspect of the present invention, a semiconductor device is provided that includes at least one of a radio transmitting circuit, a radio receiving circuit, and a radio transmitting and receiving circuit; and a DC-DC converter having the switching power supply circuit described above.

Effects of the Present Invention

In an oscillation frequency control circuit according to an embodiment of the present invention, and a DC-DC converter and a semiconductor device having the oscillation frequency control circuit, the switching frequency for the DC-DC converter is changed back and forth between a predetermined lower limit frequency and a predetermined upper limit frequency, and further, the switching frequency is continually swept between those frequencies. Because of this feature, it may become possible to continually distribute the noise over a wide frequency range. Therefore, it may become possible to reduce a time period when the switching frequency is present at a frequency that may influence a specific frequency being used in the radio transmitting and receiving circuit to a moment, thereby enabling reducing the switching noise level to an acceptable level in practical use.

Further, according to an embodiment of the present invention, the swept frequency range may be randomly changed while keeping the difference between the lower limit frequency and the upper limit frequency at a constant value. Because of this feature, it may become possible to largely reduce the noise level to an acceptable level in practical use.

DESCRIPTION OF THE REFERENCE NUMERALS

1: DC-DC CONVERTER
2: OSCILLATION CIRCUIT
3: CONTROL CIRCUIT
4, 4a: FREQUENCY CONTROL CIRCUIT
11: UP/DOWN CONTROL CIRCUIT
12: FIRST FREQUENCY COMPARISON CIRCUIT
13: SECOND FREQUENCY COMPARISON CIRCUIT
14: FIRST DIVISION CIRCUIT
15: SECOND DIVISION CIRCUIT
21: FIRST LATCH CIRCUIT
22: SECOND LATCH CIRCUIT
31: FIRST ADDITION CIRCUIT
32: SECOND ADDITION CIRCUIT
33: RANDOM NUMBER GENERATION CIRCUIT

BEST MODE FOR CARRYING OUT THE INVENTION

Next, the embodiments of the present invention are described in detail with reference to the accompanying drawings.

First Embodiment

Figure 1:
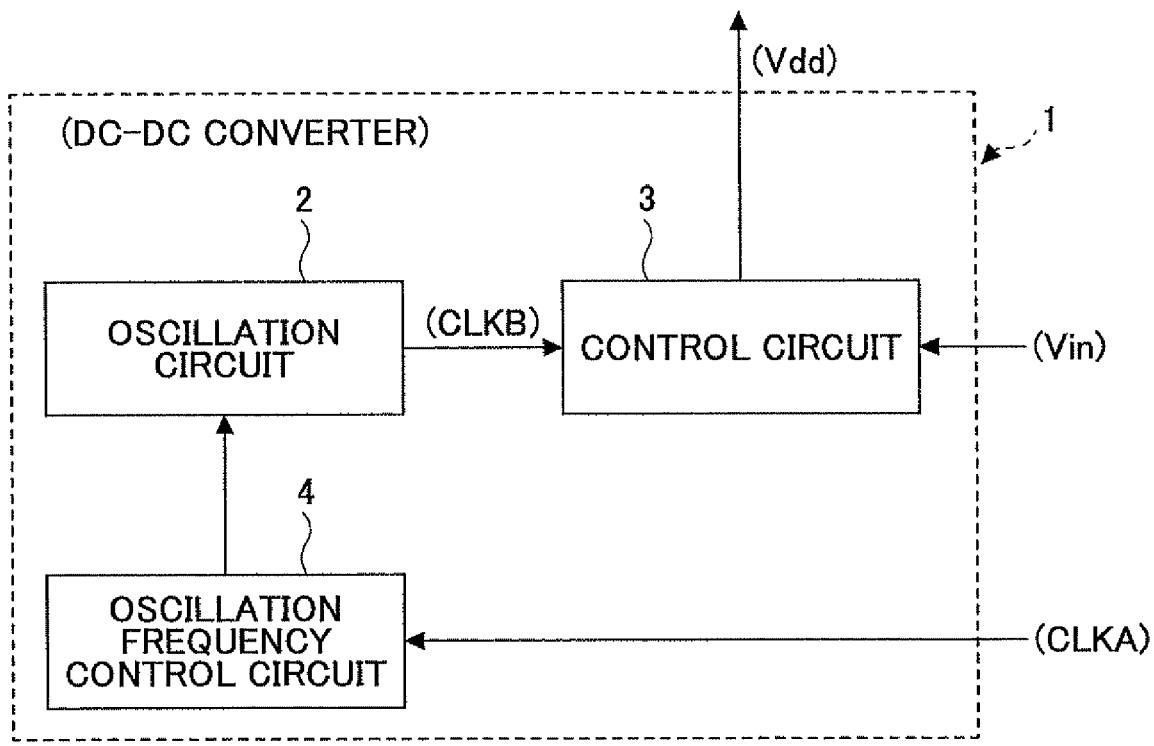
FIG. 1 is a block diagram showing an example of a DC-DC converter using an oscillation frequency control circuit according to a first embodiment of the present invention.

FIG. 1 is a block diagram showing an example of a DC-DC converter 1 using an oscillation frequency control circuit 4 according to a first embodiment of the present invention.

As shown in FIG. 1, the DC-DC converter 1 such as a switching regulator is configured to convert an input voltage Vin input to the DC-DC converter into a predetermined constant voltage and output the converted constant voltage as a power supply voltage Vdd, and includes an oscillation circuit 2 generating a second clock signal CLKB, a control circuit 3 inputting the second clock signal CLKB, and the oscillation frequency control circuit 4 controlling the oscillation frequency of the oscillation circuit 2.

A predetermined first clock signal CLKA serving as a reference clock signal is externally input to the oscillation frequency control circuit 4. The second clock signal CLKB output from the oscillation circuit 2 is input to the control circuit 3 and used for performing ON/OFF control of a switching device (not shown) in the control circuit 3, so that the control circuit 3 converts the input voltage Vin into the predetermined constant voltage using the input second clock signal CLKB and generates the power supply voltage Vdd.

Figure 2:
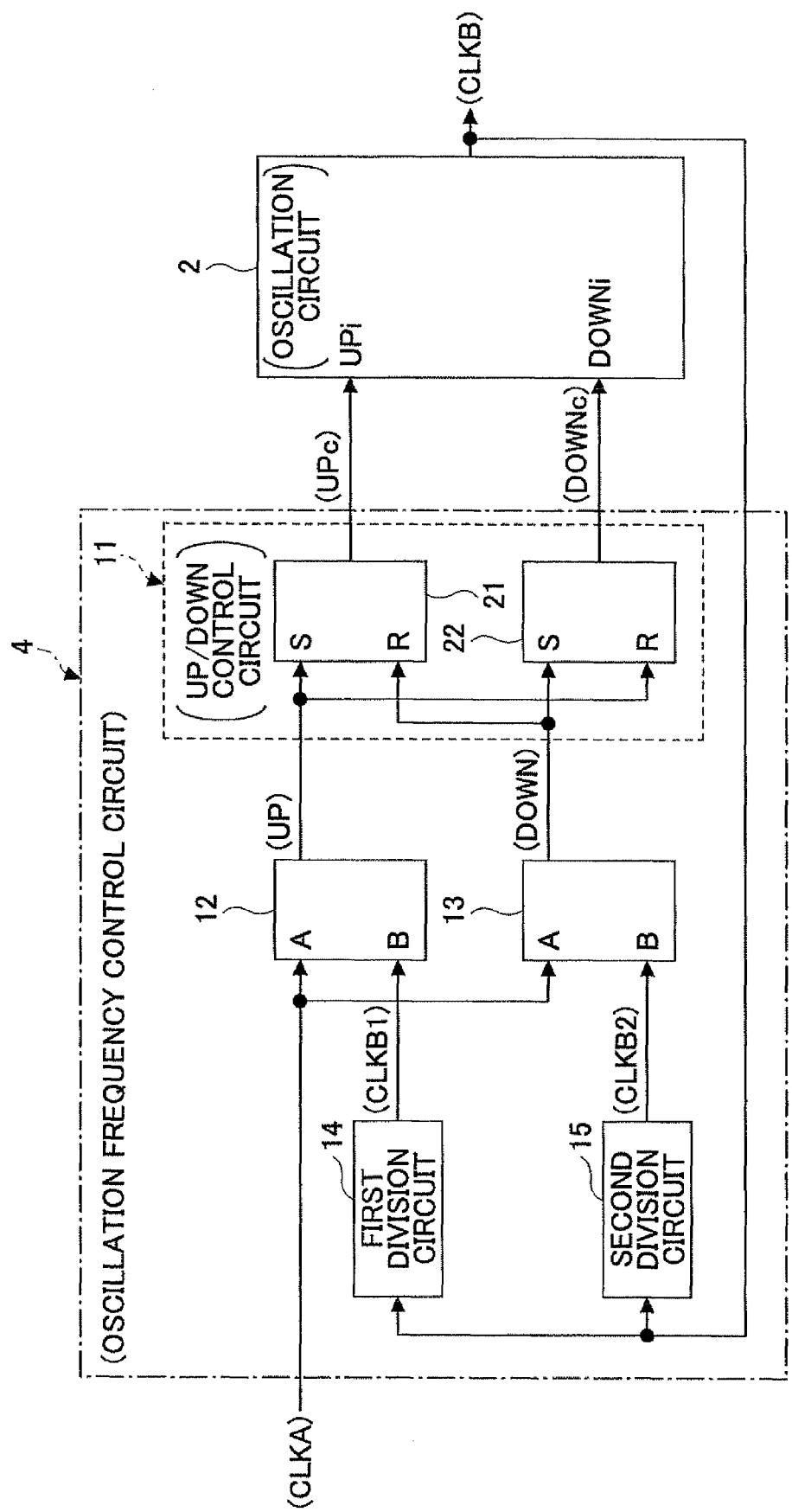
FIG. 2 is a block diagram showing an example of circuit configuration of the oscillation frequency control circuit according to the first embodiment of the present invention.

FIG. 2 is a block diagram showing an example of a configuration of an oscillation frequency control circuit according to the first embodiment of the present invention. In other words, FIG. 2 is a block diagram showing an exemplary configuration of the oscillation frequency control circuit 4 in FIG. 1.

As shown in FIG. 2, the oscillation frequency control circuit 4 includes an UP/DOWN control circuit 11, a first frequency comparison circuit 12, a second frequency comparison circuit 13, a first division circuit 14, and a second division circuit 15. Herein, the UP/DOWN control circuit 11 constitutes a frequency control circuit unit. On the other hand, the first frequency comparison circuit 12, the second frequency comparison circuit 13, the first division circuit 14, and the second division circuit 15 constitute a frequency difference detection circuit unit.

The second clock signal CLKB is input to the first division circuit 14. The first division circuit 14 divides the input second clock signal CLKB to generate and output the first division clock signal CLKB1 having a frequency of one-forty sixth (1/46) of that of the second clock signal CLKB. Further, the second clock signal CLKB is input to the second division circuit 15. The second division circuit 15 divides the input second clock signal CLKB to generate and output the second division clock signal CLKB2 having a frequency of one-seventy sixth (1/76) of that of the second clock signal CLKB. Both of the first clock signal CLKA and the first division clock signal CLKB1 are input to the first frequency comparison circuit 12. The first frequency comparison circuit 12 compares the frequency of the first clock signal CLKA with the frequency of the first division clock signal CLKB1, generates an up signal UP indicating the comparison result, and outputs the generated up signal UP to the UP/DOWN control circuit 11. For example, in a case where the frequency of the first division clock signal CLKB1 input to an input terminal B of the first frequency comparison circuit 12 is lower than the frequency of the first clock signal CLKA input to an input terminal A of the first frequency comparison circuit 12, the first frequency comparison circuit 12 outputs a high-level up signal UP. On the other hand, when the frequency of the first division clock signal CLKB1 is equal to or higher than the frequency of the first clock signal CLKA, the first frequency comparison circuit 12 outputs a low-level up signal UP.

Further, both of the first clock signal CLKA and the second division clock signal CLKB2 are input to the second frequency comparison circuit 13. The second frequency comparison circuit 13 compares the frequency of the first clock signal CLKA with the frequency of the second division clock signal CLKB2, generates a down signal DOWN indicating the comparison result, and outputs the generated down signal DOWN to the UP/DOWN control circuit 11. For example, in a case where the frequency of the second division clock signal CLKB2 input to an input terminal B of the second frequency comparison circuit 13 is higher than the frequency of the first clock signal CLKA input to an input terminal A of the second frequency comparison circuit 13, the second frequency comparison circuit 13 outputs a high-level down signal DOWN. On the other hand, when the frequency of the second division clock signal CLKB2 is equal to or lower than the frequency of the first clock signal CLKA, the second frequency comparison circuit 13 outputs a low-level down signal DOWN.

The UP/DOWN control circuit 11 includes a first latch circuit 21 and a second latch circuit 22. The up signal UP and the down signal DOWN are input to a set input terminal S and the a reset input terminal R, respectively, of the first latch circuit 21. An up control signal UPc is output from an output terminal of the first latch circuit 21 to an input terminal UPi of the oscillation circuit 2. On the other hand, The down signal DOWN and the up signal UP are input to a set input terminal S and the a reset input terminal R, respectively, of the second latch circuit 22. A down control signal DOWNc is output from an output terminal of the second latch circuit 22 to an input terminal DOWNi of the oscillation circuit 2.

The operation of the first latch circuit 21 is the same as that of the second latch circuit 22. More specifically, in both the first latch circuit 21 and the second latch circuit 22, when a signal level at the set input terminal S becomes high, a high-level signal is output, and even when the signal level at the set input terminal S returns to low, the high-level signal is continued to be output. Further, in both the first latch circuit 21 and the second latch circuit 22, when a signal level at the reset input terminal R becomes high, a low-level signal is output, and even when the signal level at the reset input terminal R returns to low, the low-level signal is continued to be output.

While the level of the up control signal UPc is high, the oscillation circuit 2 operates so as to increase the frequency of the second clock signal CLKB being currently output. On the other hand, while the level of the down control signal DOWNc is high, the oscillation circuit 2 operates so as to reduce the frequency of the second clock signal CLKB being currently output.

As described above, the UP/DOWN control circuit 11 controls the oscillation circuit 2 so that when the level of the up signal UP is high, the frequency of the second clock signal CLKB increases until the level of the down signal DOWN becomes high and when the level of the down signal DOWN is high, the frequency of the second clock signal CLKB decreases until the level of the up signal UP becomes high. In other words, the UP/DOWN control circuit 11 controls the oscillation circuit 2 so that when the up signal UP indicates that the frequency of the first division clock signal CLKB1 is lower than that of the first clock signal CLKA, the frequency of the second clock signal CLKB increases until the down signal DOWN indicates that the frequency of the second division clock signal CLKB2 is higher than that of the first clock signal CLKA, and when the down signal DOWN indicates that the frequency of the second division clock signal CLKB2 is higher than that of the first clock signal CLKA, the frequency of the second clock signal CLKB decreases until the up signal UP indicates that the frequency of the first division clock signal CLKB1 is lower than that of the first clock signal CLKA.

Figure 3:
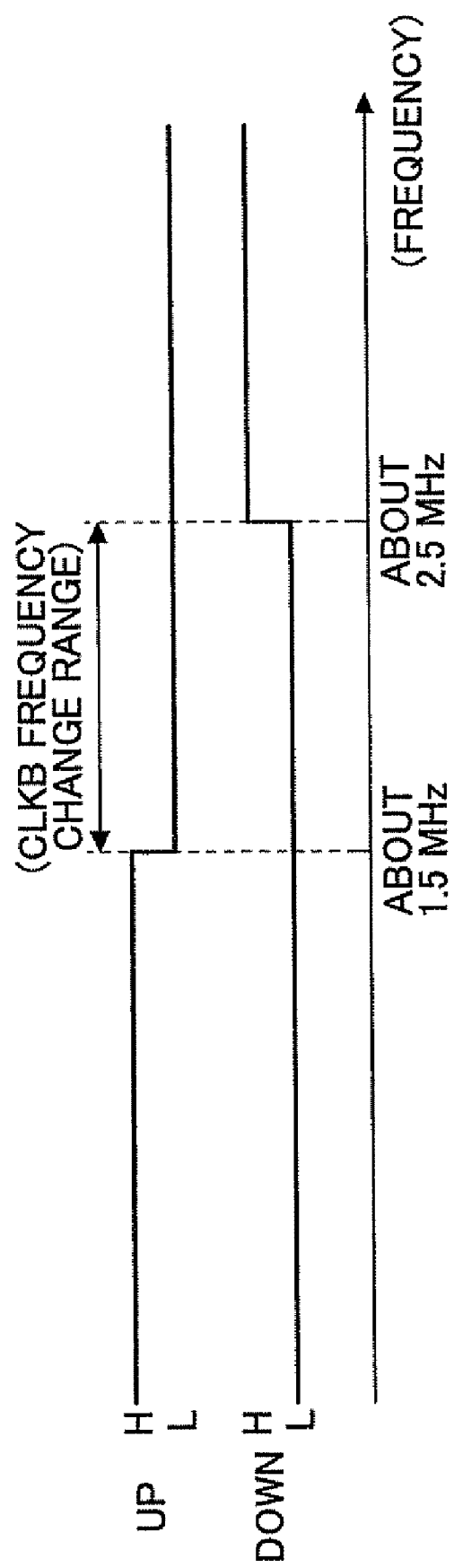
FIG. 3 is a drawing showing an example of an up signal UP and a down signal DOWN shown in FIG. 2.

FIG. 3 shows examples of the up signal UP and the down signal DOWN shown in FIG. 2. FIG. 3 shows a case where the frequency of the first clock signal CLKA is 32.768 kHz.

As described above, the division ratio of the first division circuit 14 is given as 46 (divided by 46). Therefore, in order that the frequency of the first division clock signal CLKB1 be equal to the frequency (32.768 kHz) of the first clock signal CLKA, the frequency of the second clock signal CLKB is about 1.5 MHz. Therefore, for example, the level of the up signal UP is high when the frequency of the second clock signal CLKB is less than about 1.5 MHz, and the level of the up signal UP is low when the frequency of the second clock signal CLKB is equal to or higher than about 1.5 MHz.

Similarly, the division ratio of the second division circuit 15 is given as 76 (divided by 76). Therefore, in order that the frequency of the second division clock signal CLKB2 be equal to the frequency (32.768 kHz) of the first clock signal CLKA, the frequency of the second clock signal CLKB is about 2.5 MHz. Therefore, for example, the level of the down signal DOWN is low when the frequency of the second clock signal CLKB is equal to or less than about 2.5 MHz, and the level of the down signal DOWN is high when the frequency of the second clock signal CLKB is higher than about 2.5 MHz.

In such a configuration, when the frequency of the second clock signal CLKB is lower than 1.5 MHz, as described above, in this case the level of the up signal UP is high, and the level of the down signal DOWN is low. Therefore, the first latch circuit 21 is set and the level of the up control signal UPc is high. On the other hand, the second latch circuit 22 is reset and the level of the down control signal DOWNc is low.

Since the level of the up control signal UPc is high, the frequency of the second clock signal CLKB output from the oscillation circuit 2 increases. When the frequency of the second clock signal CLKB is higher than 1.5 MHz, the level of the up signal UP is low. However, the first latch circuit 21 is not reset until the level of the down control signal DOWN becomes high; therefore the high level of the up control signal UPc continues. As a result, the frequency of the second clock signal CLKB further increases.

When the frequency of the second clock signal CLKB is higher than 2.5 MHz, the first latch circuit 21 is reset and the level of the up control signal UPc is low and the second latch circuit 22 is set and the level of the down control signal DOWNc is high. As a result, the increase of frequency of the second clock signal CLKB stops and the reduction of the frequency of the second clock signal CLKB starts. When the frequency of the second clock signal CLKB is lower than 2.5 MHz, the high level of the down control signal DOWNc output from the second latch circuit 22 continues. Therefore, the frequency of the second clock signal CLKB further reduces.

When the frequency of the second clock signal CLKB returns lower than 1.5 MHz, the level of the up signal UP is high. Therefore, the first latch circuit 21 is set and the level of the up control signal UPc is high, and the second latch circuit 22 is reset and the level of the down control signal DOWNc is low. As a result, the frequency of the second clock signal CLKB increases again.

By repeating the operation described above, the frequency of the second clock signal CLKB continually switches back and forth between the frequencies 1.5 MHz and 2.5 MHz. Therefore, the switching noise at the switching frequency of a switching regulator can be continually distributed over the wide frequency range. Because of this feature, it may become possible to reduce the time period when the switching frequency is present at a frequency that may influence a specific frequency used in the radio transmitting and receiving circuit to a moment, thereby enabling greatly reducing the switching noise level to an acceptable level in practical use.

In the first embodiment of the present invention, a case is described where the division ratio n of the first division circuit 14 is given as 46 (divided by 46) and the division ratio m of the second division circuit 15 is given as 76 (divided by 76). However, these are exemplary values and the present invention is not limited to the values of the division ratios. The values of the division ratios of the first division circuit 14 and the second division circuit 15 may be determined freely.

Further, in the first embodiment of the present invention, a case is described where the frequency of the first clock signal CLKA, which is a reference frequency, is set to 32.768 kHz. However, according to the present invention, the frequency of the first clock signal CLKA is not limited to this value. Many electronic devices include a circuit having a clock function called a real time clock (RTC). Even when the power is turned OFF, the RTC generates an accurate clock signal used for a clock function. As the frequency of the clock signal, a signal having a frequency of 32.768 kHz is widely used in view of the size, the cost, and the consumption current. Therefore, in the first embodiment of the present invention, this clock signal is also used for the reference clock signal. Further, it is assumed that the first clock signal CLKA is always input at least when power is being supplied.

Second Embodiment

In the above first embodiment, the noise with respect to a specific frequency used in the radio transmitting and receiving circuit may be greatly reduced to an acceptable level in practical use. However, each division ratio of first division circuit 14 and the second division circuit 15 is fixed. Therefore, peak energy of the noise may slightly increase near the center frequency of 2 MHz. To overcome this problem, each division ratio of the first division circuit 14 and the second division circuit 15 may be configured to be changed, and such a configuration is described as the second embodiment of the present invention.

Figure 4:
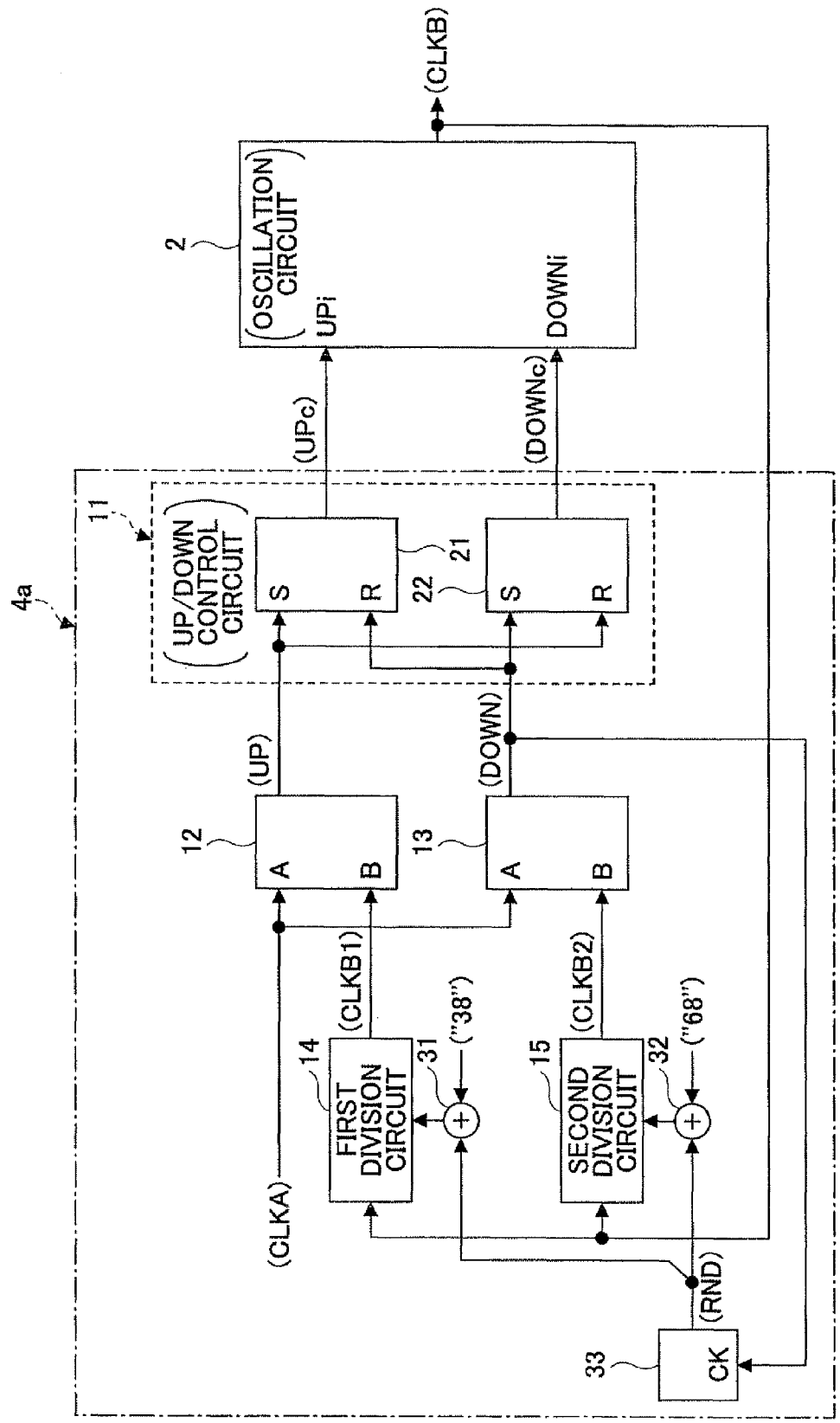
FIG. 4 is a block diagram showing an example of circuit configuration of the oscillation frequency control circuit according to a second embodiment of the present invention.

FIG. 4 is a block diagram showing an exemplary configuration of an oscillation frequency control circuit 4a according to the second embodiment of the present invention. In FIG. 4, the same reference numerals are used to describe the same elements as described in FIG. 2 without further description. Namely, only the different matters are herein described. Further, description of the DC-DC converter using the oscillation frequency control circuit shown in FIG. 4 is also omitted because the DC-DC converter in FIG. 4 is the same as the DC-DC converter in FIG. 1 except the reference numeral of the oscillation frequency control circuit.

The configuration in FIG. 4 is different from that in FIG. 2 in that the division ratios of the first division circuit 14 and the second division circuit 15 may be due to the addition of a first addition circuit 31, a second addition circuit 32, and a random number generation circuit 33. With this configuration change, the reference numeral of the oscillation frequency control circuit is changed from 4 in FIGS. 2 to 4a in FIG. 4.

As shown in FIG. 4, the oscillation frequency control circuit 4a includes the UP/DOWN control circuit 11, the first frequency comparison circuit 12, the second frequency comparison circuit 13, the first division circuit 14, the second division circuit 15, the first addition circuit 31, the second addition circuit 32, and the random number generation circuit 33. In this configuration, the first frequency comparison circuit 12, the second frequency comparison circuit 13, the first division circuit 14, the second division circuit 15, the first addition circuit 31, the second addition circuit 32, and the random number generation circuit 33 constitute the frequency difference detection circuit unit.

Further, as shown in FIG. 4, the down signal DOWN is input to an input terminal CK of the random number generation circuit 33. When the level of the down signal DOWN changes from low to high, the random number generation circuit 33 generates fifteen random numbers 1 through 15 and outputs one number of the generated random numbers as numerical data RND to each of the input terminals of the first addition circuit 31 and the second addition circuit 32. In the following, for example, a case is described where numerical data "38" is input to the other input terminal of the first addition circuit 31 and numerical data "68" is input to the other input terminal of the second addition circuit 32. In this case, in the first addition circuit 31, the numerical data RND indicating any one of the generated random numbers 1 through 15 and output from the random number generation circuit 33 is added to the numerical data "38" to obtain a number n(=RND+38). Then the obtained number n is output to the first division circuit 14, so that the number n is set to the division ratio of the first division circuit 14. Similarly, in the second addition circuit 32, the numerical data RND indicating any one of the generated random numbers 1 through 15 and output from the random number generation circuit 33 is added to the numerical data "68" to obtain a number m(=RND+68). Then the obtained number m is output to the second division circuit 15, so that the number m is set to the division ratio of the second division circuit 15.

Further, for example, a case is considered where the random number generation circuit 33 outputs a value "1" as the numerical data RND. In this case, the division ratio of the first division circuit 14 is set to 39 (divided by 39) and the division ratio of the second division circuit 15 is set to 69 (divided by 69). In the following, it is assumed that the frequency of the first clock signal CLKA is 32.768 kHz. In this case, the lower limit frequency and the upper limit frequency of the second clock signal CLKB become about 1.3 MHz and about 2.3 MHz, respectively. Further, for example, in a case where the random number generation circuit 33 outputs a value "15" as the numerical data RND, the division ratios of the first division circuit 14 and the second division circuit 15 are set to 53 and 83, respectively. In this case, the lower limit frequency and the upper limit frequency of the second clock signal CLKB become about 1.7 MHz and about 2.7 MHz, respectively.

As described above, regardless of the value of the numerical data RND output from the random number generation circuit 33, the difference between the upper limit frequency and the lower limit frequency of the second clock signal CLKB is kept at a substantially constant value of 1 MHz, and the difference between the division ratio of the first division circuit 14 and second division circuit 15 is also kept at a constant value of 30.

Figure 5:
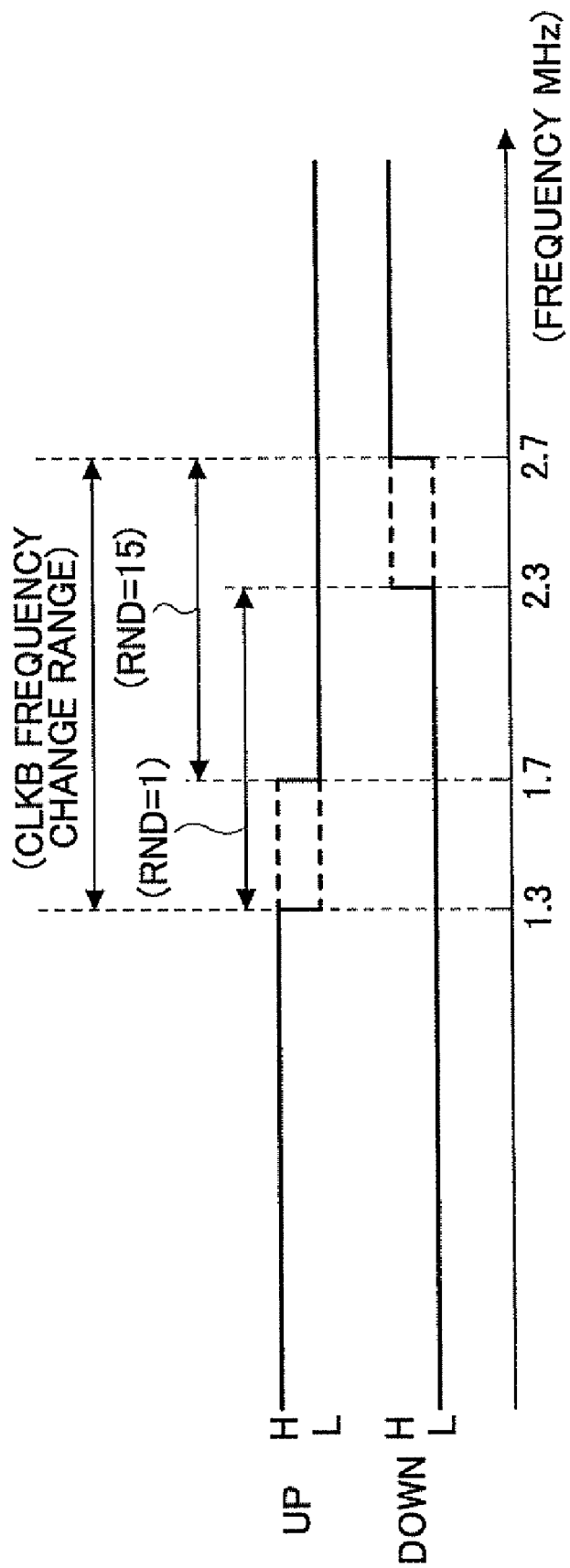
FIG. 5 is a drawing showing an example of the up signal UP and the down signal DOWN shown in FIG. 4.
Figure 6:
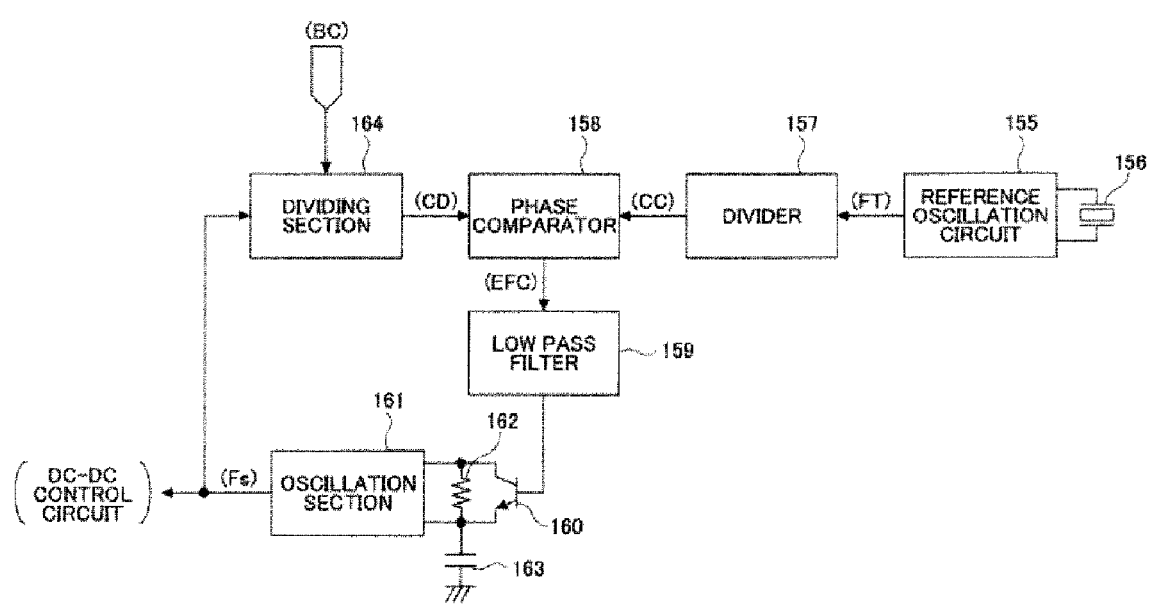
FIG. 6 is a drawing showing an exemplary configuration of a clock signal generation circuit for driving a switching transistor in a conventional DC-DC converter.
Figure 7:
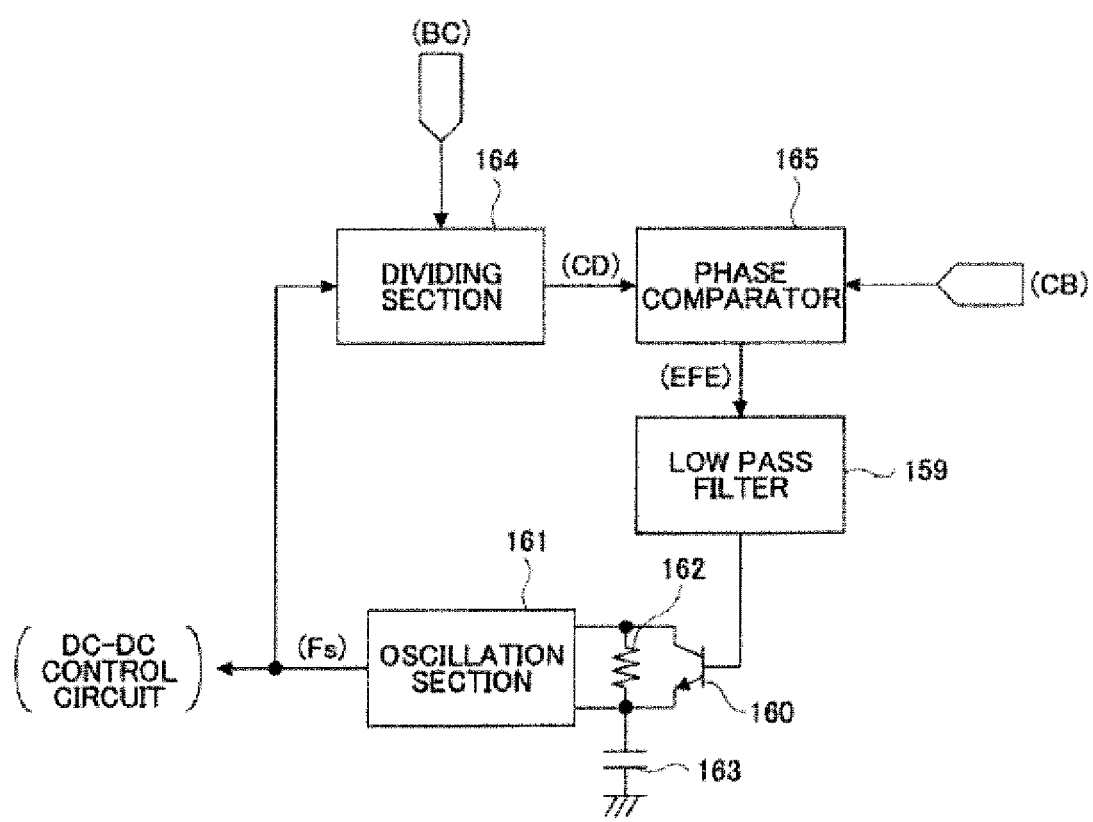
FIG. 7 is a drawing showing another exemplary configuration of a clock signal generation circuit for driving a switching transistor in a conventional DC-DC converter.
Figure 8:
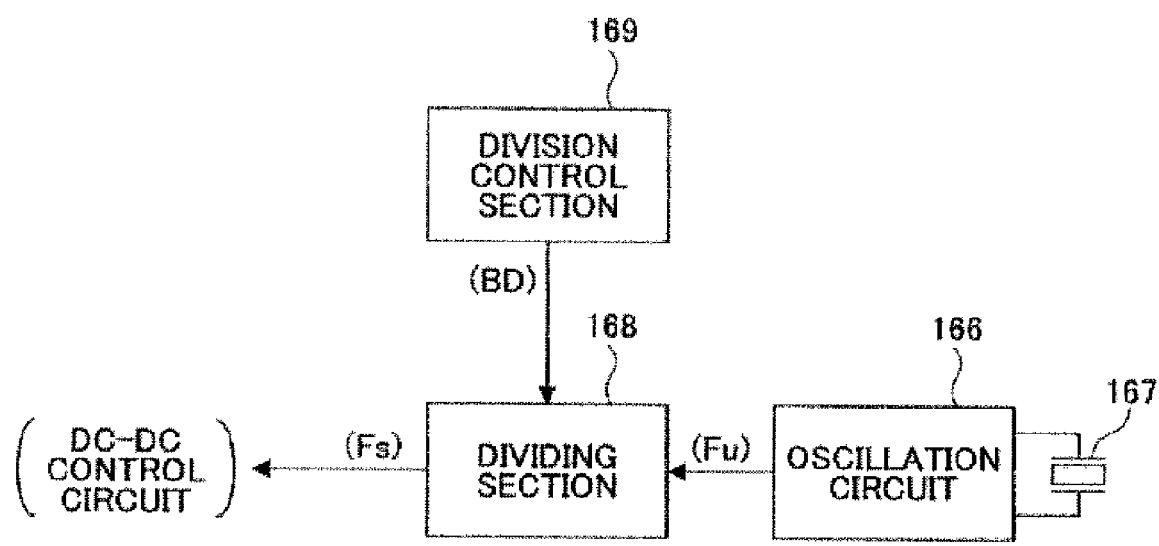
FIG. 8 is a drawing showing still another exemplary configuration of a clock signal generation circuit for driving a switching transistor in a conventional DC-DC converter.

FIG. 5 shows examples of the up signal UP and the down signal DOWN in the configuration of FIG. 4.

As shown in FIG. 5, when a value "1" of the numerical data RND is output from the random number generation circuit 33, the level of the up signal UP is high when the frequency of the second clock signal CLKB is lower than about 1.3 MHz, and the level of the up signal UP is low when the frequency of the second clock signal CLKB is equal to or higher than about 1.3 MHz. On the other hand, the level of the down signal DOWN is low when the frequency of the second clock signal CLKB is lower than about 2.3 MHz, and the level of the down signal DOWN is high when the frequency of the second clock signal CLKB is equal to or higher than about 2.3 MHz.

Further, when a value "15" of the numerical data RND is output from the random number generation circuit 33, the level of the up signal UP is high when the frequency of the second clock signal CLKB is lower than about 1.7 MHz, and the level of the up signal UP is low when the frequency of the second clock signal CLKB is equal to or higher than about 1.7 MHz. On the other hand, the level of the down signal DOWN is low when the frequency of the second clock signal CLKB is equal to or lower than about 2.7 MHz, and the level of the down signal DOWN is high when the frequency of the second clock signal CLKB is equal to or higher than about 2.7 MHz.

In the oscillation frequency control circuit 4a, the same numerical value of the random number is added to the fixed value of the division ratio of the first division circuit 14 and the fixed value of the division ratio of the second division circuit 15. Therefore, the difference between the division ratio of the first division circuit 14 and the division ratio of the second division circuit 15 is kept at a constant value, and accordingly the difference between the upper limit frequency and the lower limit frequency of the second clock signal CLKB is also kept at a constant value.

As described above, according to the second embodiment of the present invention, the upper limit frequency and the lower limit frequency of the second clock signal CLKB are determined in accordance with the numerical data RND indicating any one number of the generated random numbers 1 through 15 and output from the random number generation circuit 33 and fixed numerical data input to the first addition circuit 31 and the second addition circuit 32; therefore the difference between the upper limit frequency and the lower limit frequency of the second clock signal CLKB is kept at a constant value. Because of the features, the same effects as those in the first embodiment of the present invention may be achieved, and the peak energy of the noise may be distributed because the center frequency between the upper limit frequency and the lower limit frequency of the second clock signal CLKB varies.

In the above description, a case is described where when the level of the down signal DOWN becomes high, both division ratios of first and second division circuits 14 and 15 are changed. However, the present invention is not limited to this configuration. For example, both division ratios of first and second division circuits 14 and 15 may be changed when the level of the up signal UP becomes high. To that end, the up signal UP is input to the input terminal CK of the random number generation circuit 33.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teachings herein set forth.

The present application is based on and claims the benefit of priority of Japanese Patent Application No. 2008-026454, filed on Feb. 6, 2008, the entire contents of which are hereby incorporated herein by reference.

The invention claimed is:

1. An oscillation frequency control circuit configured to control an oscillation circuit generating and outputting a second clock signal having a frequency in response to an input control signal so that the oscillation frequency control circuit controls the frequency of the second clock signal, the oscillation frequency control circuit comprising:
 a frequency difference detection circuit unit configured to detect a difference between a frequency of a predetermined first clock signal input externally and the frequency of the second clock signal, and generate and output a signal indicating a result of the detection; and
 a frequency control circuit unit configured to control the frequency of the second clock signal so that the frequency of the second clock signal continually changes back and forth between a predetermined lower limit value and a predetermined upper limit value in response to the output signal from the frequency difference detection circuit.

2. The oscillation frequency control circuit according to claim 1, wherein
 the frequency difference detection circuit unit includes
 a first division circuit configured to divide the second clock signal by a preset first division ratio, and generate and output a first division clock signal;
 a second division circuit configured to divide the second clock signal by a preset second division ratio, and generate and output a second division clock signal;
 a first frequency comparison circuit configured to compare the frequency of the first clock signal with the frequency of the first division clock signal, and generate and output a signal indicating a result of the comparison; and
 a second frequency comparison circuit configured to compare the frequency of the first clock signal with the frequency of the second division clock signal, and generate and output a signal indicating a result of the comparison, wherein the frequency control circuit unit controls the oscillation circuit so that the frequency of the second clock signal continually changes back and forth between a predetermined lower limit value and a predetermined upper limit value in response to output signals from the first frequency comparison circuit and the second frequency comparison circuit.

3. The oscillation frequency control circuit according to claim 2, wherein
 the frequency control circuit unit controls the oscillation circuit so that when the output signal of the first frequency comparison circuit indicates that the frequency of the first division clock signal is lower than the frequency of the first clock signal, the frequency of the second clock signal is increased until the output signal of the second frequency comparison circuit indicates that the frequency of the second division clock signal is higher than the frequency of the first clock signal, and when the output signal of the second frequency comparison circuit indicates that the frequency of the second division clock signal is higher than the frequency of the first clock signal, the frequency of the second clock signal is reduced until the output signal of the first frequency comparison circuit indicates that the frequency of the first division clock signal is lower than the frequency of the first clock signal.

4. The oscillation frequency control circuit according to claim 2, wherein
 the frequency control circuit unit includes
 a first latch circuit having a set input terminal and a reset input terminal, the output signal of the first frequency comparison circuit being input to the set input terminal, and the output signal of the second frequency comparison circuit being input to the reset input terminal; and
 a second latch circuit having a set input terminal and a reset input terminal, the output signal of the second frequency comparison circuit being input to the set input terminal, and the output signal of the first frequency comparison circuit being input to the reset input terminal, wherein
 each of the first latch circuit and the second latch circuit is configured to output an output signal to the oscillation circuit to control the frequency of the second clock signal of the oscillation circuit.

5. The oscillation frequency control circuit according to claim 2, wherein
 the frequency of the first division clock signal indicates a lower limit frequency of the second clock signal, and the frequency of the second division clock signal indicates an upper limit frequency of the second clock signal.

6. The oscillation frequency control circuit according to claim 2, wherein
 each of the first division circuit and the second division circuit performs a division process by a division ratio indicated by a corresponding input signal.

7. The oscillation frequency control circuit according to claim 6, wherein
 the frequency difference detection circuit unit further includes
 a random number generation circuit configured to randomly select and output one numeric value from among numeric values within a predetermined range in accordance with the output signal of the second frequency comparison circuit;
 a first addition circuit configured to add a value output from the random number generation circuit to a predetermined first value and output a result of the addition to the first division circuit; and a second addition circuit configured to add a value output from the random number generation circuit to a predetermined second value and output a result of the addition to the second division circuit, wherein the first division circuit performs the division process by the division ratio in accordance with a numeric value input from the first addition circuit, and the second division circuit performs the division process by the division ratio in accordance with a numeric value input from the second addition circuit.

8. The oscillation frequency control circuit according to claim 7, wherein the random number generation circuit randomly selects and outputs one numeric value from among numeric values within the predetermined range when the output signal of the second frequency comparison circuit indicates that the frequency of the second division clock signal is higher than the frequency of the first clock signal.

9. The oscillation frequency control circuit according to claim 6, wherein the frequency difference detection circuit unit further includes a random number generation circuit configured to randomly select and output one numeric value from among numeric values within a predetermined range in accordance with the output signal of the first frequency comparison circuit;

a first addition circuit configured to add a value output from the random number generation circuit to a predetermined first value and output a result of the addition to the first division circuit; and a second addition circuit configured to add a value output from the random number generation circuit to a predetermined second value and output a result of the addition to the second division circuit, wherein the first division circuit performs the division process by the division ratio in accordance with a numeric value input from the first addition circuit, and the second division circuit performs the division process by the division ratio in accordance with a numeric value input from the second addition circuit.

10. The oscillation frequency control circuit according to claim 9, wherein the random number generation circuit randomly selects and outputs one numeric value from among numeric values within the predetermined range when the output signal of the first frequency comparison circuit indicates that the frequency of the first division clock signal is lower than the frequency of the first clock signal.

11. The oscillation frequency control circuit according to claim 7, wherein the predetermined first value and the predetermined second value are determined so that a difference between the frequency of the first division clock signal and the frequency of the second division clock signal is kept substantially constant.

12. The oscillation frequency control circuit according to claim 1, wherein the first clock signal is always being input to the frequency difference detection circuit unit at least when power is being supplied.

13. A DC-DC converter having a switching power supply circuit, the DC-DC converter comprising:

an oscillation circuit configured to generate and output a second clock signal having a frequency in response to an input control signal;

a control circuit configured to convert an input voltage to a predetermined constant voltage by performing switching control with respect to a switching device in the switching power supply circuit based on the second clock signal of the oscillation circuit; and an oscillation frequency control circuit according to claim 1, the oscillation frequency control circuit being configured to control the frequency of the second clock signal of oscillation circuit.

14. The DC-DC converter according to claim 13, wherein the switching power supply circuit is configured to supply power to at least one of a radio transmitting circuit, a radio receiving circuit, and a radio transmitting and receiving circuit.

15. A semiconductor device comprising:

at least one of a radio transmitting circuit, a radio receiving circuit, and a radio transmitting and receiving circuit; and a DC-DC converter having the switching power supply circuit according to claim 13.

* * * * *